(12) United States Patent
Bobba et al.

(10) Patent No.: US 6,694,493 B2
(45) Date of Patent: Feb. 17, 2004

(54) DECOUPLING CAPACITANCE ASSIGNMENT TECHNIQUE WITH MINIMUM LEAKAGE POWER

(75) Inventors: Sudhakar Bobba, Sunyvale, CA (US); Tyler Thorp, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 166 days.

(21) Appl. No.: 09/992,515

(22) Filed: Nov. 14, 2001

(65) Prior Publication Data

US 2003/0093761 A1 May 15, 2003

(51) Int. Cl.$^7$ ............................................. G06F 17/50
(52) U.S. Cl. ................... 716/2; 716/1; 716/10
(58) Field of Search .................... 716/1, 2, 10

(56) References Cited

U.S. PATENT DOCUMENTS 5,366,920 A * 11/1994 Yamamichi et al. ........ 438/396
5,734,583 A * 3/1998 Shou et al. ..................... 716/1
5,811,868 A * 9/1998 Bertin et al. ................ 257/516

* cited by examiner

Primary Examiner—Vuthe Siek
Assistant Examiner—Sun James Lin
(74) Attorney, Agent, or Firm—Rosenthal & Osha L.L.P.

(57) ABSTRACT

A method and apparatus for assigning decoupling capacitors on an integrated circuit such that leakage power is minimized is provided. Particularly, the method and apparatus use an available capacitance area of an integrated circuit, a capacitance requirement of the integrated circuit, an available thin-oxide capacitance amount, and an available thick-oxide capacitance amount to generate an assignment that indicates what percentage of the available capacitance area should be filled with thin-oxide capacitors and what percentage of the available capacitance area should be filled with thick-oxide capacitors in order to meet the capacitance requirement and minimize leakage power attributable to the thin-oxide and thick-oxide capacitors.

22 Claims, 4 Drawing Sheets

DECOUPLING CAPACITANCE ASSIGNMENT TECHNIQUE WITH MINIMUM LEAKAGE POWER

BACKGROUND OF INVENTION

A typical computer system has at least a microprocessor and memory. The microprocessor processes, i.e., executes, instructions to accomplish various tasks of the computer system. Such instructions, along with the data required by the microprocessor when executing these instructions, are stored in some form of memory. FIG. 1 shows a typical computer system having a microprocessor (10) and some form of memory (12). The microprocessor (10) has, among other components, a central processing unit (also known and referred to as "CPU" or "execution unit") (14) and a memory controller (also known as "load/store unit") (16). The CPU (14) is where the actual arithmetic and logical operations of the computer system take place. To facilitate the execution of operations by the CPU (14), the memory controller (16) provides the CPU (14) with necessary instructions and data from the memory (12). The memory controller (16) also stores information generated by the CPU (14) into the memory (12).

The operations that occur in a computer system, such as the logical operations in the CPU and the transfer of data between the CPU and memory, require power. If the components responsible for carrying out specific operations do not receive adequate power in a timely manner, computer system performance is susceptible to degradation. As an added challenge, power consumption of modern computers has increased as a consequence of increased operating frequencies. Thus, providing power to the components in a computer system in a sufficient and timely manner has become an issue of significant importance.

Often, power supply to a particular computer system element varies, which, in turn, effects the integrity of the element's output. Typically, this power variation results from the distance between a power supply for the element and the element itself. This distance may lead to the element not receiving power (via current) at the exact time it is required.

As shown in FIG. 2, one approach used by designers to combat this performance-inhibiting behavior is introducing decoupling capacitance (also referred to as "decap") to a particular circuit by positioning one or more decoupling capacitors (13) close to elements (15) in an integrated circuit (17). These decoupling capacitors (13) store charge from the power supply and distribute the charge to the elements (15) when needed. For example, if power received by a element from a power supply (19) attenuates, one or more decoupling capacitors (13) will distribute charge to the element (15) to ensure that the element (15) is not affected by the power variation on the power supply (19). In essence, a decoupling capacitor acts as a local power supply for one or more specific elements in a computer system.

However, important considerations must be made as to the assignment of one or more decoupling capacitors to particular capacitance needing elements because capacitors have particular undesirable characteristics. One such characteristic pertains to two types of capacitors: thin-oxide capacitors and thick-oxide capacitors. A thin-oxide capacitor is designed using one or more transistors that have thin gate dielectric thicknesses, and although thin-oxide capacitors provide a relatively large amount of decoupling capacitance, they are prone to undesirable gate-tunneling leakage currents. Such leakage current, in turn, increases the leakage power of a circuit, resulting in increased power dissipation by the circuit. Alternatively, a thick-oxide capacitor is designed using one or more transistors that have thick gate dielectric thicknesses, and although thick-oxide capacitors have less leakage currents, they provide a small amount of decoupling capacitance relative to thin-oxide capacitors. Thus, there is a need for a technique that assigns thin and thick decoupling capacitors such that decoupling capacitance requirements on a circuit are met while minimizing an amount of leakage power dissipated by the decoupling capacitors.

SUMMARY OF INVENTION

According to one aspect of the present invention, a method for assigning thin-oxide and thick-oxide capacitors on an integrated circuit, where the integrated circuit having a capacitance requirement and an available capacitance area, and where the method comprises determining a first amount of capacitance assuming that the available capacitance area is filled with thin-oxide capacitors, determining a second amount of capacitance assuming that the available capacitance area is filled with thick-oxide capacitors, defining a possible capacitance range as a range between the first amount of capacitance and the second amount of capacitance, determining if the capacitance requirement is within the possible capacitance range, and if the capacitance requirement is within the possible capacitance range, assigning thin-oxide capacitors to a first percentage of the available capacitance area, and assigning thick-oxide capacitors to a second percentage of the available capacitance area.

According to another aspect, a computer system comprises a processor, a memory, and instructions, residing in the memory and executable by the processor, for using a capacitance requirement of an integrated circuit, an available capacitance area on the integrated circuit, an available thin-oxide capacitance amount, and an available thick-oxide capacitance amount in order to generate an assignment of thin-oxide and thick-oxide capacitors on the integrated circuit.

According to another aspect, a computer-readable medium having recorded therein instructions executable by processing, the instructions for determining an available thin-oxide capacitance amount, determining an available thick-oxide capacitance amount, and if a capacitance requirement of an integrated circuit is within a certain range, generating an assignment of thin-oxide capacitors on a first percentage of the integrated circuit, and generating an assignment of thick-oxide capacitors on a second percentage of the integrated circuit, where the range is formed by the thin-oxide capacitance amount and the thick-oxide capacitance amount.

According to another aspect, a method for graphically determining an assignment of thin-oxide and thick-oxide capacitors on an available capacitance area of an integrated circuit comprises using a first point to represent an available amount of thin-oxide decoupling capacitance, using a second point to represent an available amount of thick-oxide decoupling capacitance, forming a relationship between the first point and the second point, and determining an intersection of the relationship with a predefined relationship, where the intersection comprises a first component and second component, where the first component represents a first percentage of the available capacitance area to be assigned to thin-oxide capacitors, and where the second component represents a second percentage of the available capacitance area to be assigned to thick-oxide capacitors.

Other aspects and advantages of the invention will be apparent from the following description and the appended claims.

DETAILED DESCRIPTION

Embodiments of the present invention relate to a method and apparatus for assigning thin-oxide and thick-oxide decoupling capacitors such that decoupling capacitance requirements of a circuit are met. Embodiments of the present invention further relate to a method and apparatus for minimizing an amount of leakage power dissipated by decoupling capacitors in an integrated circuit. Embodiments of the present invention relate to a method for optimizing a ratio of thin-oxide decoupling capacitors to thick-oxide decoupling capacitors such that decoupling capacitance requirements are met while minimizing a total amount of leakage power dissipated by the thin-oxide and thick-oxide decoupling capacitors. Embodiments of the present invention further relate to a method for graphically determining an optimal ratio of thin-oxide decoupling capacitors to thick-oxide decoupling capacitors such that (1) decoupling capacitance requirements are met and (2) leakage power due to the thin-oxide and thick-oxide decoupling capacitors is reduced.

Figure 1:
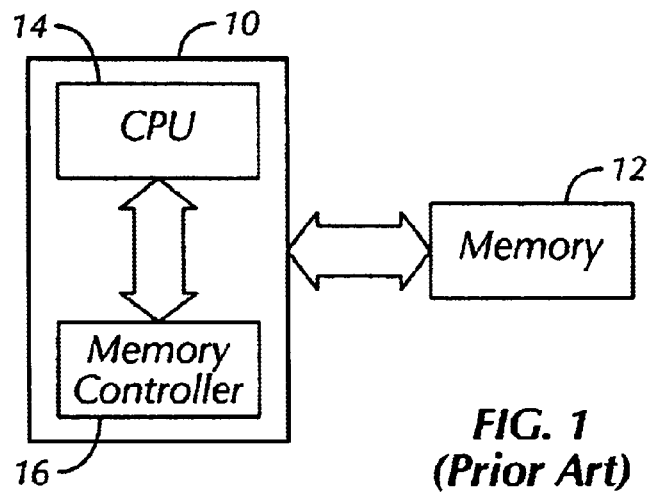
FIG. 1 shows a typical computer system.
Figure 2:
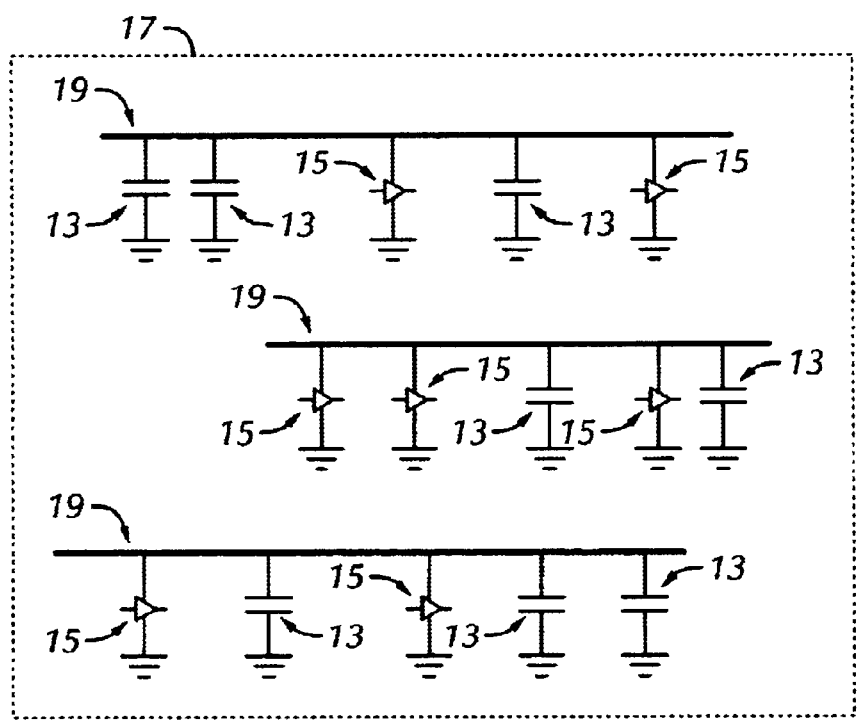
FIG. 2 shows a typical arrangement of decoupling capacitors and circuit elements.
Figure 3A:
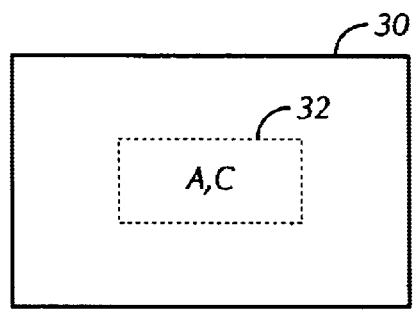
FIG. 3a shows an integrated circuit in accordance with an embodiment of the present invention.

FIG. 3a shows an exemplary integrated circuit (30) in accordance with an embodiment of the present invention. A section (32) on the circuit (30) has a particular area (shown in FIG. 3a as A) and a capacitance requirement (shown in FIG. 3a as C). To meet this capacitance requirement, a percentage, $X_{thin}$, of an available capacitance area on the section (32) is populated with thin-oxide decoupling capacitors (not shown), and a percentage, $X_{thick}$, of the available capacitance area on the section (32) is populated with thick-oxide decoupling capacitors (not shown). The goal is to determine values for $X_{thin}$ and $X_{thick}$ such that the capacitance requirement is met while reducing the amount of leakage power dissipated on the circuit (30) due to the thin-oxide and thick-oxide decoupling capacitors in the section (32). The problem is expressed in Equation (1):

$$L_{thin}*X_{thin}*A+L_{thick}*X_{thick}*A=L_{area}, \quad (1)$$

where $L_{thin}$ represents the leakage current per unit area of the thin-oxide decoupling capacitors, $X_{thin}$ represents the percentage of the available capacitance area on the section (32) populated by the thin-oxide decoupling capacitors, A represents the available capacitance area of the section (32), $L_{thick}$ represents the leakage current per unit area of the thick-oxide decoupling capacitors, $X_{thick}$ represents the percentage of the available capacitance area on the section (32)

populated by the thick-oxide decoupling capacitors, and $L_{area}$ represents the leakage current for the section (32) resulting from the thin-oxide and thick-oxide decoupling capacitors. Thus, it follows that if $L_{area}$ is to be minimized, the percentage of the available capacitance area on the section (32) populated by the thick-oxide decoupling capacitors must be maximized because the thick-oxide decoupling capacitors contribute less leakage current than the thin-oxide decoupling capacitors.

However, one may not simply populate the entire available capacitance area of the section with thick-oxide decoupling capacitors. This is because capacitance requirements likely would not be met due to the low capacitance provided by thick-decoupling capacitors. This constraint on Equation (1) is expressed below in Equation (2). Further, Equation (1) is constrained in Equation (3) below by the fact that $X_{thin}$ and $X_{thick}$ cannot total a sum greater than 100 percent.

$$C_{thin}*X_{thin}*A+C_{thick}*X_{thick}*A>=C_{need} \quad (2)$$

$$X_{thin}+X_{thick}<=1, \quad (3)$$

where, in Equation (2), $C_{thin}$ represents the amount of capacitance contributed by the thin-oxide decoupling capacitors, $C_{thick}$ represents the amount of capacitance contributed by the thick-oxide decoupling capacitors, and $C_{need}$ represents the amount of capacitance required for a particular area. Therefore, by maximizing $X_{thick}$ subject to the restriction in Equation (3) and meeting the capacitance requirement, $C_{need}$, expressed in Equation (2), the leakage current, $L_{area}$, expressed in Equation (1) may be minimized.

In determining a solution for the problem expressed above, four cases need to be considered. The first case occurs when $C_{thin}*X_{thin}*A<C_{need}$. In this case, even if the entire available capacitance area is populated with thin-oxide decoupling capacitors, the capacitance requirement of the area is not met. Thus, in this first case, there is no solution.

The second case occurs if $C_{thin}*X_{thin}*A>C_{need}$ only when $X_{thin}=1$. In this case, the capacitance requirement of the area is met by populating the entire available capacitance area with thin-oxide decoupling capacitors. In alternative embodiments, this second may case may apply if $C_{thin}*X_{thin}*A$ 'substantially equals' $C_{need}$ in designs where, for example, a slight deficit or overage in decoupling capacitance may be tolerated.

The third case occurs if the capacitance requirement of the area may be met by populating the entire available capacitance area with thick-oxide decoupling capacitors, i.e., $C_{thick}*X_{thick}*A>=C_{need}$, where $X_{thick}=1$. In this case, leakage current is at a minimum because only thick-oxide decoupling capacitors are used.

A fourth case occurs when the capacitance requirement is less than the maximum available decoupling capacitance, i.e., the capacitance requirement is less than the amount of decoupling capacitance that would be present if the available capacitance area were to be entirely populated by thin-oxide decoupling capacitors, but greater than the amount of decoupling capacitance that would be present if the available capacitance area were to be entirely populated by thick-oxide decoupling capacitors. Thus, in this case, $C_{thin}*X_{thin}*A>C_{need}$ and $C_{thick}*X_{thick}*A<C_{need}$. Remembering that the total amount of leakage current dissipated by the thin-oxide and thick-oxide decoupling capacitors may be minimized by maximizing $X_{thick}$, an assignment of thin-oxide and thick-oxide decoupling capacitors may be determined by as solution of the problem of meeting the capacitance requirement while reducing the cumulative leakage current as expressed below in Equations (4) and (5):

$$X_{thin} = ((C_{need}/(C_{thick}*A)) - 1)/(r-1) \qquad (4)$$

$$X_{thick} = (r - (C_{need}/(C_{thick}*A)))/(r-1), \qquad (5)$$

where $r = C_{thin}/C_{thick}$.

Those skilled in the art will appreciate that although the section (32) of the integrated circuit (32) is shown in FIG. 3a as having a particular size and shape, the section (32) may be of any size and/or shape depending on design parameters.

Figure 3B:
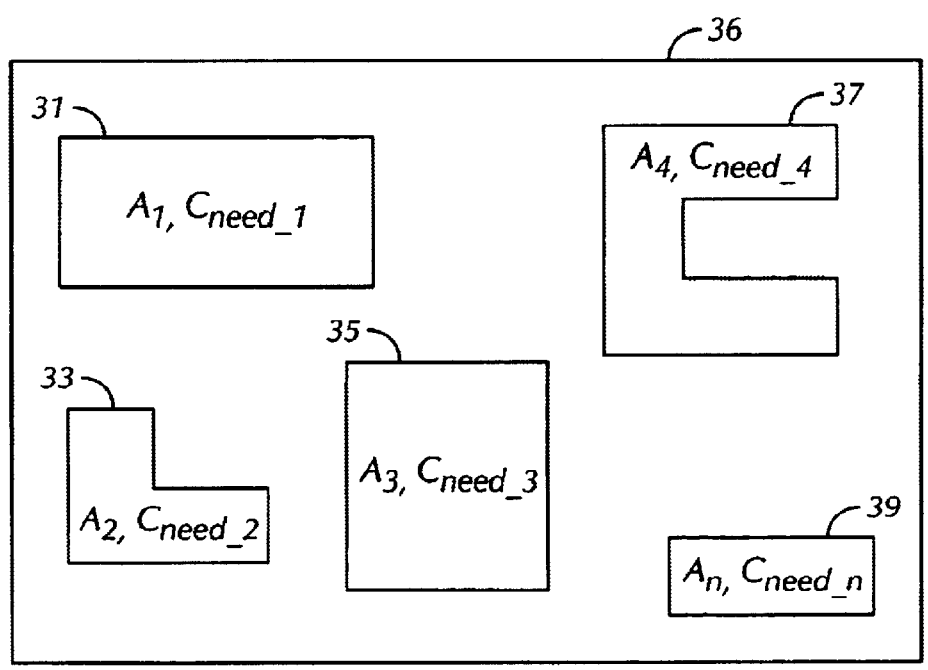
FIG. 3b shows an integrated circuit in accordance with another embodiment of the present invention.

FIG. 3b shows an integrated circuit (36) in accordance with another embodiment of the present invention. In FIG. 3b, the integrated circuit (36) has a plurality of sections (31, 33, 35, 37, 39) of varying shapes and sizes, where each section has a particular area, $A_1$–$A_n$, and a decoupling capacitance requirement, $C_{need\_1}$–$C_{need\_n}$. The decoupling capacitor assignment technique discussed above with reference to FIG. 3a may be used for the plurality of sections (31, 33, 35, 37, 39) on the integrated circuit (36) shown in FIG. 3b.

In another embodiment, the areas, $A_1$–$A_n$, and decoupling capacitance requirements, $C_{need\_1}$–$C_{need\_n}$, of each section (31, 33, 35, 37, 39) are respectively summed to equal a total area, $A_{total}$, and a total decoupling capacitance requirement, $C_{need\_total}$. An assignment of thin-oxide and thick-oxide decoupling capacitors is determined using the various assignment techniques described in the present invention. Available capacitance areas of each section (31, 33, 35, 37, 39) are then populated with the percentages of thin-oxide decoupling capacitors and thick-oxide decoupling capacitors determined in the assignment technique, i.e., each section (31, 33, 35, 37, 39) has a percentage, i.e., $X_{thin}$, of its available capacitance area populated with thin-oxide decoupling capacitors and a percentage, i.e., $X_{thick}$, of its available capacitance area populated with thick-oxide decoupling capacitors. Those skilled in the art will appreciate that by assigning decoupling capacitors on a plurality of sections using the assignment techniques presented in the present invention, one may minimize the amount of leakage current on each individual area, thus, effectively minimizing the cumulative leakage power for the areas being considered.

Figure 4:
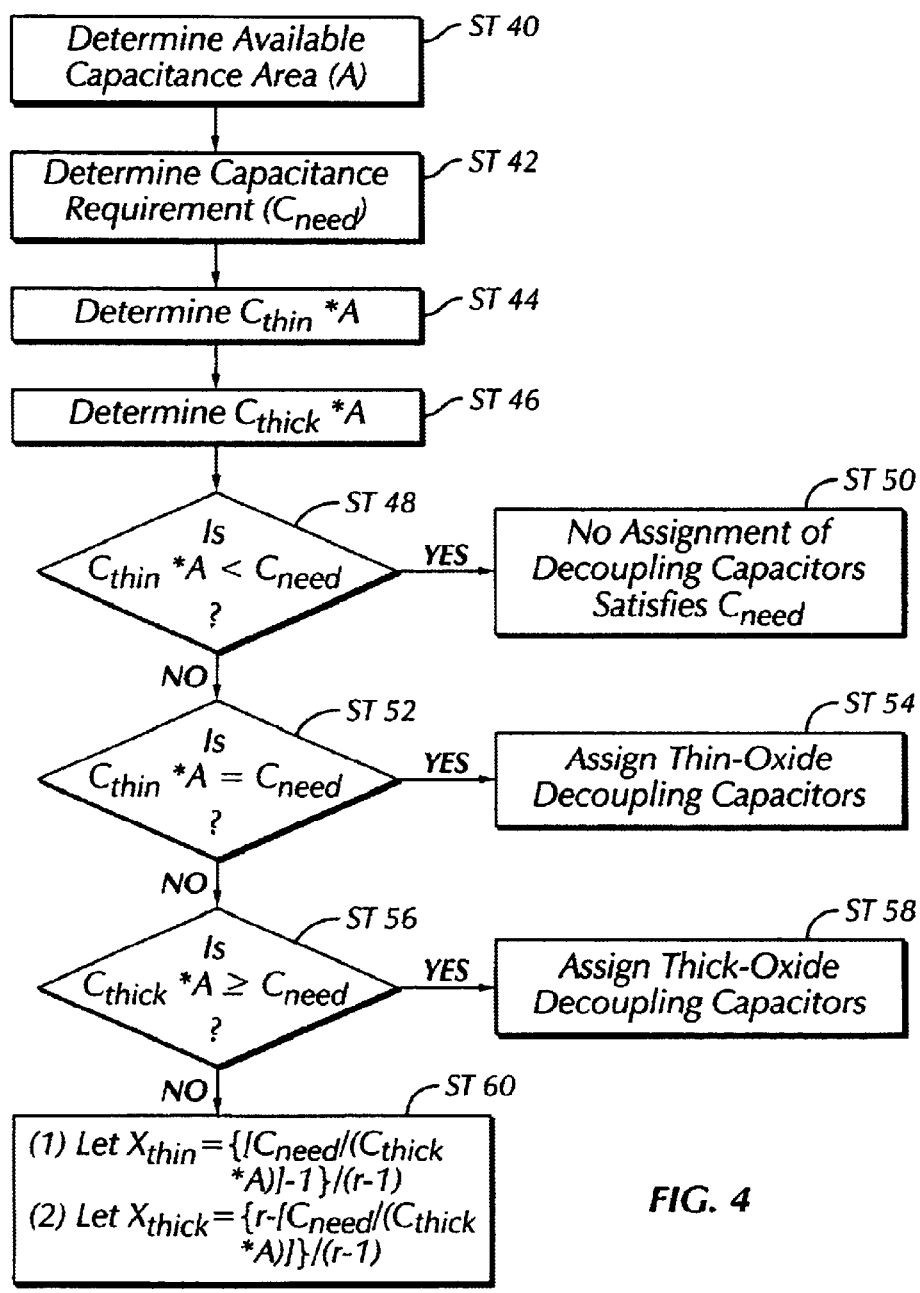
FIG. 4 shows a flow process in accordance with an embodiment of the present invention.

FIG. 4 shows an exemplary flow process in accordance with an embodiment of the present invention. In a design process, a location on an integrated circuit is selected to include one or more decoupling capacitors. Once the location is selected or defined, a determination is made as to how much area, A, is available to mount the one or more decoupling capacitors (step 40). Thereafter, a determination is made as to the decoupling capacitance requirement, $C_{need}$, of the area (step 42). Thereafter, a determination is made as to the maximum amount of decoupling capacitance, i.e., $C_{thin}*A$, that may be mounted in the area (step 44). A determination is also made as to the amount of decoupling capacitance that would be present if only thick-oxide decoupling capacitors, i.e., $C_{thick}*A$, were mounted in the area (step 46). Those skilled in the art will appreciate that these values, i.e., $C_{thin}*A$ and $C_{thick}*A$, provide a circuit designer with a range of available decoupling capacitance.

Using the range of available decoupling capacitance, a verification is made as to whether the decoupling capacitance requirement is within or below the available decoupling capacitance range. First, a determination is made as to whether the decoupling capacitance requirement, i.e., $C_{need}$, is greater than an upper bound of the available decoupling capacitance range, i.e., $C_{thin}*A < C_{need}$ (step 48). If $C_{need}$ is greater than $C_{thin}*A$, then there is not enough decoupling capacitance available to meet the decoupling capacitance requirement, and thus, there is no assignment of decoupling capacitors that satisfies the decoupling capacitance requirement (step 50). Those skilled in the art will appreciate that in this case, a circuit designer may make more decoupling capacitors available and/or increase the amount of area available for capacitor population.

If $C_{need}$ is not greater than $C_{thin}*A$, then a determination is made as to whether $C_{need}$ equals $C_{thin}*A$ (step 52). If $C_{need}$ does equal $C_{thin}*A$, then the available capacitance area is populated by thin-oxide decoupling capacitors (step 54). In this case, because the decoupling capacitance requirement is met using only thin-oxide decoupling capacitors, the leakage current attributable to decoupling capacitors in the area is both at a maximum and a minimum.

If $C_{need}$ is neither greater than nor equal to $C_{thin}*A$, then a determination is made as to whether $C_{thick}*A >= C_{need}$ (step 56). If $C_{need}$ is less than or equal to $C_{thick}*A$, then the available capacitance area is populated by thick-oxide decoupling capacitors (step 58). In this case, because the decoupling capacitance requirement is met using only thick-oxide decoupling capacitors, the leakage current attributable to decoupling capacitors in the area is at a minimum. If, however, $C_{need}$ is neither less than nor equal to $C_{thick}*A$ and neither greater than nor equal to $C_{thin}*A$, then the available capacitance area is populated according to Equations (4) and (5) (step 60). In other words, in this case, the decoupling capacitance requirement is met by maximizing the percentage of thick-decoupling capacitors and minimizing the percentage of thin-oxide decoupling capacitors.

Those skilled in the art will appreciate that the exemplary flow process shown in FIG. 4 may be repeated in the case that a plurality of areas on an integrated circuit are being considered.

Further, those skilled in the art will appreciate that although the flow process discussed with reference to FIG. 4 is directed to a design of an integrated circuit, the flow process may be applied in the design of other computer system components, such as circuit boards.

Still referring to FIG. 4, an application of the exemplary flow process is described in the following. Consider a particular location on an integrated circuit that has an available capacitance area of 10 $\mu^2$ (step 40) and a decoupling capacitance requirement of 200 $\mu$F (step 42). Further, consider the decoupling capacitance per unit area of a thin-oxide decoupling capacitor to be 50 $\mu F/\mu^2$ and the decoupling capacitance per unit area of a thick-oxide decoupling capacitor to be 10 $\mu F/\mu^2$. Using the given values, $C_{thin}*A$ equals 500 $\mu$F (step 44) and $C_{thick}*A$ equals 100 $\mu$F (step 46). Thus, the range of available decoupling capacitance is between 100 $\mu$F and 500 $\mu$F. It is important to note that this range is indicative of the available decoupling capacitance if one thin-oxide decoupling capacitor and one thick-oxide decoupling capacitor is available for use. It is presumed that in most designs, there are a plurality of available thin-oxide and thick-oxide decoupling capacitors, and thus, the range of available decoupling capacitance varies accordingly.

Using the exemplary range of 100–500 $\mu$F, a determination is made as to whether the upper bound of the range, i.e., 500 $\mu$F, is less than the decoupling capacitance requirement, i.e., 200 $\mu$F (step 48). Because the upper bound of the range is not less than the decoupling capacitance requirement, a further determination is made as to whether the upper bound of the range, i.e., 500 $\mu$F, equals the decoupling capacitance requirement, i.e., 200 $\mu$F (step 52). Because the upper bound of the range is not equal to the decoupling capacitance requirement, a further determination is made as to whether $C_{thick}*A$, i.e., 100 $\mu$F, is greater than or equal to the decoupling capacitance requirement, i.e., 200 $\mu$F (step 56).

Because $C_{thick}*A$ is neither greater than nor equal to the decoupling capacitance requirement, the assignment of decoupling capacitors is determined according to Equations (4) and (5) (step 60).

Using Equations (4) and (5) in solving for $X_{thin}$ and $X_{thick}$ using the exemplary values discussed above, $X_{thin}=((200\ \mu F/(10\ \mu F/\mu^2*10\mu^2))-1)/(5-1)$, or 0.25, and $X_{thick}=(5-(200\ \mu F/(10\ \mu F/\mu^2*10\ \mu^2)))/(5-1)$, or 0. Therefore, 25% of the available capacitance area is assigned to thin-oxide decoupling capacitors and the remaining 75% of the available capacitance area is assigned to thick-oxide decoupling capacitors. Those skilled in the art will appreciate that this assignment of decoupling capacitors also results in a minimum leakage current due to the formulation of Equations (4) and (5).

Figure 5:
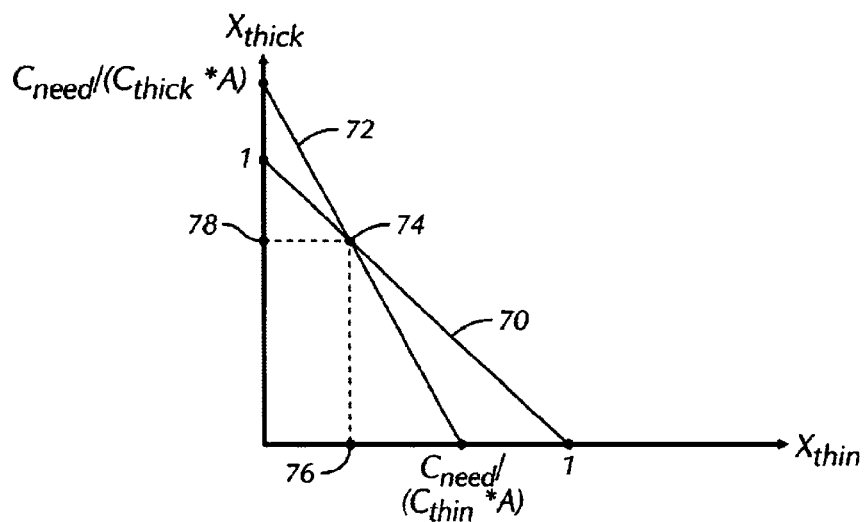
FIG. 5 shows a graphical decoupling capacitance assignment technique in accordance with an embodiment of the present invention.

FIG. 5 shows an exemplary graphical decoupling capacitance assignment technique in accordance with an embodiment of the present invention. In FIG. 5, an x-axis represents $X_{thin}$ and a y-axis represents $X_{thick}$. A first line (70) connects (1,0) and (0,1), where the first line (70) represents the constraint provided in Equation (3).

A value of $C_{need}/(C_{thin}*A)$ is determined and plotted on the x-axis and a value of $C_{need}/(C_{thick}*A)$ is determined and plotted on the y-axis. Thereafter, a second line (72) is used to connect $(C_{need}/(C_{thin}*A), 0)$ and $(0, C_{need}/(C_{thick}*A))$. Once the second line (72) is represented, an intersection point (74) of the first line (70) and the second line (72) is determined. The intersection point (74) of the first and second lines (70, 72) represents a solution in which a decoupling capacitance requirement of an area being considered is met while keeping leakage current attributable to decoupling capacitors in the area at a minimum.

The intersection point (74) has a x-component (76) and a y-component (78). The x-component (76) corresponds to the percentage of available capacitance area that is populated with thin-oxide decoupling capacitors and the y-component (78) corresponds to the percentage of available capacitance area that is populated with thick-oxide decoupling capacitors.

Figure 6:
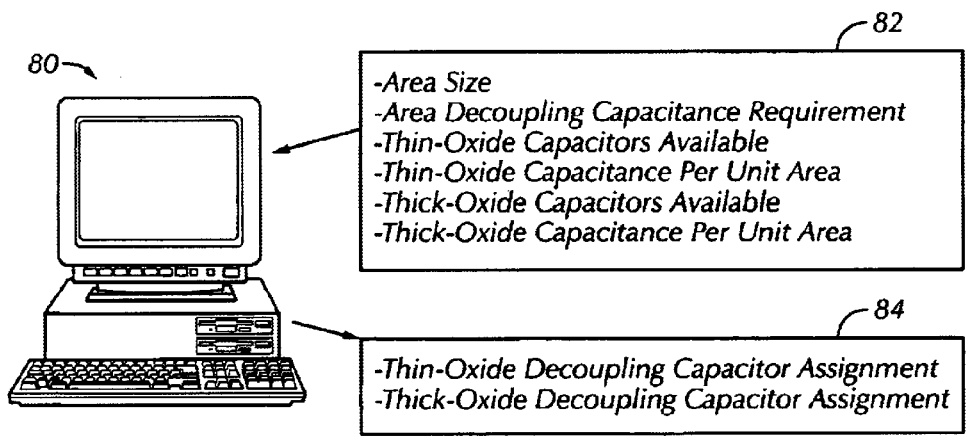
FIG. 6 shows a computer system in accordance with an embodiment of the present invention.

FIG. 6 shows an exemplary computer system (80) that determines decoupling capacitor assignments in accordance with an embodiment of the present invention. Input parameters (82) include an available capacitance area size for a particular area being considered, an area decoupling capacitance requirement for the area being considered, an amount of thin-oxide capacitors available for the area being considered, a value of capacitance per unit area for the thin-oxide decoupling capacitors, an amount of thick-oxide capacitors available, and a value of capacitance per unit area for the thick-oxide decoupling capacitors. One of ordinary skill in the art will understand that the input parameters (82) may include additional values for the thin-oxide and thick-oxide capacitances per unit area depending on whether the thin-oxide and/or thick-oxide decoupling capacitors have various capacitance per unit area values.

The input parameters (82) serve as input data to the computer system (80) via some computer-readable medium, e.g., network path, floppy disk, input file, etc. The computer system (80) then stores the input parameters (82) in memory (not shown) to subsequently determine (via microprocessor functions) a decoupling capacitor assignment using one of the various assignment techniques discussed in the present invention. Thereafter, the computer system (80) outputs the decoupling capacitor assignment (84) via some user-readable medium, e.g., monitor display, network path, etc., where the assignment includes at least a percentage of the available capacitance area being considered that is to be filled with thin-oxide decoupling capacitors and a percentage of the available capacitance area being considered that is to be filled with thick-oxide decoupling capacitors. The computer system (80) may additionally output the amount of leakage current resulting from the particular decoupling capacitor assignment.

Those skilled in the art will appreciate that in other embodiments, a software program capable of generating an assignment of thin-oxide and thick-oxide capacitors consistent with the assignment techniques presented in the present invention may be used. The software program may also be capable of determining leakage current and power values corresponding to the generated assignment of thin-oxide and thick-oxide capacitors.

Advantages of the present invention may include one or more of the following. In some embodiments, a decoupling capacitor assignment technique for thin-oxide and thick-oxide decoupling capacitors ensures that (1) a decoupling capacitance requirement is met and (2) leakage power attributable to the thin-oxide and thick-oxide decoupling capacitors is at a minimum.

In some embodiments, because a decoupling capacitor assignment technique for thin-oxide and thick-oxide decoupling capacitors considers leakage current contributed by the thin-oxide and thick-oxide decoupling capacitors, leakage power dissipated on an integrated circuit may be reduced.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for assigning thin-oxide and thick-oxide capacitors on an integrated circuit, the integrated circuit having a capacitance requirement and an available capacitance area, the method comprising:

determining a first amount of capacitance assuming that the available capacitance area is filled with said thin-oxide capacitors;

determining a second amount of capacitance assuming that the available capacitance area is filled with said thick-oxide capacitors;

defining a capacitance range as a range between the first amount of capacitance and the second amount of capacitance;

determining if the capacitance requirement is within the capacitance range; and if the capacitance requirement is within the capacitance range, assigning said thin-oxide capacitors to a first percentage of the available capacitance area, and assigning said thick-oxide capacitors to a second percentage of the available capacitance area in order to substantially achieve the capacitance requirement and substantially minimize leakage power attributable to the assigned thin-oxide capacitors and thick-oxide capacitors.

2. The method of claim 1, wherein the first and second percentages are determined based on the capacitance requirement, the available capacitance area, the first capacitance amount, and the second capacitance amount.

3. The method of claim 1, further comprising:

assigning said thin-oxide capacitors to the integrated circuit if the first amount of capacitance is substantially equal to the capacitance requirement.

4. The method of claim 1, further comprising:
assigning said thick-oxide capacitors to the integrated circuit if the second amount of capacitance is less than the capacitance requirement.

5. The method of claim 1, further comprising:
assigning said thick-oxide capacitors to the integrated circuit if the second amount of capacitance is equal to the capacitance requirement.

6. The method of claim 1, wherein the method further comprises assigning said thin-oxide and said thick-oxide capacitors for a particular section on the integrated circuit.

7. The method of claim 1, wherein the method further comprises assigning said thin-oxide and said thick-oxide capacitors for a plurality of sections on the integrated circuit.

8. The method of claim 1, wherein the first percentage is equivalent to $((Cneed/(Cthick*A)) -1)/((Cthin/Cthick) -1)$, wherein Cneed represents the capacitance requirement, Cthin represents the first amount of capacitance, Cthick represents the second amount of capacitance, and A represents the available capacitance area.

9. The method of claim 1, wherein the second percentage is equivalent to $((Cthin/Cthick)-(Cneed/(Cthick *A)))/((Cthin/Cthick) -1)$, wherein Cneed represents the capacitance requirement, Cthin represents the first amount of capacitance, Cthick represents the second amount of capacitance, and A represents the available capacitance area.

10. A computer system, comprising:
a processor;
a memory; and
instructions, residing in the memory and executable by the processor, for using a capacitance requirement of an integrated circuit, an available capacitance area on the integrated circuit, an available thin-oxide capacitance amount, and an available thick-oxide capacitance amount in order to generate an assignment of thin-oxide and thick-oxide capacitors on the integrated circuits
wherein the assignment indicates that a first percentage of the available capacitance area be filled with said thin-oxide capacitors, wherein the assignment indicates that a second percentage of the available capacitance area be filled with said thick-oxide capacitors.

11. The computer system of claim 10, wherein the first and second percentages are determined based on the capacitance requirement, the available capacitance area, the available thick-oxide capacitance amount, and the available thin-oxide capacitance amount.

12. The computer system of claim 10, wherein the assignment indicates that said thin-oxide capacitors be used on the available capacitance area if the available thin-oxide capacitance amount substantially equals the capacitance requirement.

13. The computer system of claim 10, wherein the assignment indicates that said thick-oxide capacitors be disposed on the available capacitance area if the available thick-oxide capacitance amount is greater than the capacitance requirement.

14. The computer system of claim 10, wherein the assignment indicates that said thick-oxide capacitors be disposed on the available capacitance area if the available thick-oxide capacitance amount is equal to the capacitance requirement.

15. A computer-readable medium having recorded therein instructions executable by processing, the instructions for:
determining an available thin-oxide capacitance amount for an available capacitance area of an integrated circuit;

determining an available thick-oxide capacitance amount for the available capacitance area of the integrated circuit;

defining a capacitance range as a range between the available thin-oxide capacitance amount and the available thick-oxide capacitance amount;

determining if the capacitance requirement is within the capacitance range; and if the capacitance requirement is within the capacitance range, assigning thin-oxide capacitors to a first percentage of the available capacitance area, and assigning thick-oxide capacitors, and wherein the assignment substantially achieves the capacitance requirement and substantially minimizes leakage power attributable to the assigned thin-oxide capacitors and thick-oxide capacitors to a second percentage of the available capacitance area in order to substantially achieve the capacitance requirement and substantially minimize leakage power attributable to the assigned thin-oxide capacitors and thick-oxide capacitors.

16. The computer-readable medium of claim 15, wherein the first and second percentages are dependent on the available thin-oxide capacitance amount, the available thick-oxide capacitance amount, the capacitance requirement, and an available capacitance area on the integrated circuit.

17. The computer-readable medium of claim 15, further comprising instructions for:
generating an assignment of said thin-oxide capacitors for the integrated circuit if the thin-oxide capacitance amount is substantially equal to the capacitance requirement.

18. The computer-readable medium of claim 15, further comprising instructions for:
generating an assignment of said thick-oxide capacitors for the integrated circuit if the thick-oxide capacitance amount is less than the capacitance requirement.

19. The computer-readable medium of claim 15, further comprising instructions for:
generating an assignment of said thick-oxide capacitors for the integrated circuit if the thick-oxide capacitance amount is equal to the capacitance requirement.

20. A method for graphically determining an assignment of thin-oxide and thick-oxide capacitors on an available capacitance area of an integrated circuit, comprising:
using a first point to represent an available amount of thin-oxide decoupling capacitance;
using a second point to represent an available amount of thick-oxide decoupling capacitance;
forming a relationship between the first point and the second point; and
determining an overlap region between the relationship and a predefined relationship,
wherein the overlap region comprises a first component and second component, wherein the first component represents a first percentage of the available capacitance area to be assigned to said thin-oxide capacitors, and wherein the second component represents a second percentage of the available capacitance area to be assigned to said thick-oxide capacitors.

21. The method of claim 20, wherein the relationship is a line, and wherein the predefined relationship represents a constraint on the first and second percentages.

22. A method for reducing leakage power attributable to thin-oxide and thick-oxide capacitors by assigning said thin-oxide and thick-oxide capacitors on an available capacitance area, A, of a section on a microprocessor, the section having a capacitance requirement, Cneed, the method comprising:

determining a thin-oxide capacitance per unit area, Cthin;

determining a thick-oxide capacitance per unit area, Cthick;

determining a first percentage, wherein the first percentage is equivalent to ((Cneed/(Cthick*A))−1)/((Cthin/Cthick) −1); and determining a second percentage, wherein the second percentage is equivalent to ((Cthin/Cthick)−(Cneed/(Cthick*A)))/(((Cthin/Cthick)−1), wherein said thin-oxide capacitors are assigned on the first percentage of the available capacitance area, and wherein said thick-oxide capacitors are assigned on the second percentage of the available capacitance area.

* * * * *

UNITED STATES PATENT AND TRADEMARK OFFICE
CERTIFICATE OF CORRECTION

PATENT NO. : 6,694,493 B2
DATED : February 17, 2004
INVENTOR(S) : Sudhakar Bobba et al.

It is certified that error appears in the above-identified patent and that said Letters Patent is hereby corrected as shown below:

Column 9,
Line 38, replace "circuits" with -- circuit --;
Line 44, replace "capcaitors." with -- capacitors, and wherein the assignment substantially achieves the capacitance requirement and substantially minimizes leakage power attributable to the assigned thin-oxide capacitors and thick-oxide capacitors --.

Column 10,
Lines 12-16, delete the phrase ", and wherein the assignment substantially achieves the capacitance requirement and substantailly minimizes leakage power attributable to the assigned thin-oxide capacitors and thin-oxide capacitors".

Signed and Sealed this

Thirty-first Day of August, 2004

JON W. DUDAS
*Director of the United States Patent and Trademark Office*

UNITED STATES PATENT AND TRADEMARK OFFICE
CERTIFICATE OF CORRECTION

PATENT NO.     : 6,694,493 B2
DATED          : February 17, 2004
INVENTOR(S)    : Sudhakar Bobba et al.

It is certified that error appears in the above-identified patent and that said Letters Patent is hereby corrected as shown below:

Column 9,
Line 38, replace "circuits" with -- circuit --;
Line 44, replace "capcaitors." with -- capacitors, and wherein the assignment substantially achieves the capacitance requirement and substantially minimizes leakage power attributable to the assigned thin-oxide capacitors and thick-oxide capacitors --.

Column 10,
Lines 12-16, delete the phrase ", and wherein the assignment substantially achieves the capacitance requirement and substantially minimizes leakage power attributable to the assigned thin-oxide capacitors and thick-oxide capacitors".

This certificate supersedes Certificate of Correction issued August 31, 2004.

Signed and Sealed this

Fourteenth Day of June, 2005

JON W. DUDAS
*Director of the United States Patent and Trademark Office*